United States Patent
Huang

(10) Patent No.: US 9,521,759 B2
(45) Date of Patent: Dec. 13, 2016

(54) VERTICAL CONDUCTIVE UNIT AND MANUFACTURING METHOD THEREOF

(71) Applicant: MICROCOSM TECHNOLOGY CO., LTD., Tainan (TW)

(72) Inventor: Tang-Chieh Huang, Tainan (TW)

(73) Assignee: MICROCOSM TECHNOLOGY CO., LTD., Tainan (TW)

( * ) Notice: Subject to any disclaimer, the term of this patent is extended or adjusted under 35 U.S.C. 154(b) by 131 days.

(21) Appl. No.: 14/279,774

(22) Filed: May 16, 2014

(65) Prior Publication Data

US 2014/0338963 A1    Nov. 20, 2014

(30) Foreign Application Priority Data

May 17, 2013    (TW) .............................. 102117629 A

(51) Int. Cl.
| | |
|---|---|
| H05K 1/02 | (2006.01) |
| H05K 3/00 | (2006.01) |
| H05K 1/03 | (2006.01) |
| H05K 3/46 | (2006.01) |
| C09D 179/08 | (2006.01) |
| C08G 73/10 | (2006.01) |

(52) U.S. Cl.
CPC ........... *H05K 3/4644* (2013.01); *C08G 73/106* (2013.01); *C08G 73/1042* (2013.01); *C08G 73/1075* (2013.01); *C09D 179/08* (2013.01); *H05K 3/4676* (2013.01); *H05K 2201/0154* (2013.01)

(58) Field of Classification Search
CPC ... H05K 1/0216; H05K 1/0306; H05K 3/0023

USPC ..................................... 174/258; 216/18, 13
See application file for complete search history.

(56) References Cited

U.S. PATENT DOCUMENTS

| | | | |
|---|---|---|---|
| 6,379,159 B1 * | 4/2002 | Mune | H01L 21/486 257/E23.067 |
| 8,393,078 B2 | 3/2013 | Himori | |
| 2010/0233618 A1 | 9/2010 | Kim | |
| 2011/0079349 A1 | 4/2011 | Cho | |
| 2011/0121445 A1 | 5/2011 | Mori | |
| 2011/0123927 A1 | 5/2011 | Park | |

(Continued)

FOREIGN PATENT DOCUMENTS

| | | |
|---|---|---|
| JP | 05291372 | * 11/1993 |
| JP | 2010-209334 A | 9/2010 |

(Continued)

OTHER PUBLICATIONS 14 279774 STIC Search Results.pdf.*

(Continued)

*Primary Examiner* — Timothy Thompson
*Assistant Examiner* — Charles Pizzuto
(74) *Attorney, Agent, or Firm* — Hamre, Schumann, Mueller & Larson, P.C.

(57) ABSTRACT

The invention provides a vertical conductive unit. The vertical conductive unit comprises an insulating layer comprising a connecting via, a first conductor, a second conductor, and a third conductor. The insulating layer comprises photosensitive polyimide, and the glass transition temperature of the photosensitive polyimide is lower than about 200° C. The invention also provides a method for manufacturing the vertical conductive unit.

12 Claims, 2 Drawing Sheets

(56) References Cited

U.S. PATENT DOCUMENTS

2012/0301826 A1* 11/2012 Park .................. G03F 7/0233
430/283.1

FOREIGN PATENT DOCUMENTS

| JP | 2011-003884 A | 1/2011 |
| JP | 2011-521295 A | 7/2011 |
| KR | 10-2011-0036147 A | 4/2011 |
| TW | 201226443 A | 7/2012 |
| TW | I393506 B | 4/2013 |
| WO | 2010010911 A1 | 1/2010 |

OTHER PUBLICATIONS

Office Action dated May 15, 2015 for corresponding KR patent application No. 10-2014-0059596.
Office Action dated Dec. 9, 2014 for corresponding JP patent application No. 2014-102119.
Office Action dated Jul. 14, 2015 for corresponding JP patent application No. 2014-102119.
Office Action dated Sep. 25, 2014 for corresponding TW patent application No. 102117629.
Search Report dated Sep. 25, 2014 for corresponding TW patent application No. 102117629.

* cited by examiner

VERTICAL CONDUCTIVE UNIT AND MANUFACTURING METHOD THEREOF

BACKGROUND OF THE INVENTION

1. Field of the Invention

The present invention relates a printed laminated circuit board, and more particularly to a vertical conductive unit and a manufacturing method thereof.

2. Description of the Related Art

Because of being high in wiring density, light, and small in size, printed circuit boards are important electronic parts of various electronic appliances and widely applied in products such as notebook computers, mobile phones, digital cameras, and liquid crystal displays.

In the trend that electronic products are becoming lighter and thinner and have multiple functions, a non-mechanical drilling lamination method for manufacturing a micro via with the diameter smaller than about 5 micro-meters of a printed circuit board comprising has been developed. The micro via combines with fine wires and short spacing to achieve high density interconnection (HDI). The blank micro via obtained according to the method may be further subjected to various metallization and copper electroplating processes to achieve a blind via or a buried via that is locally interlayer-interconnected. The micro via may also be filled with a silver paste or a copper paste to replace the difficult metallization and copper electroplating processes to achieve electrical connection, and an insulating layer is required to be provided between layers.

However, miniaturization of the printed circuit board faces many challenges. When a digital signal or an analog signal enters a high speed or high frequency (for example, radio frequency (RF) or microwave) environment, electromagnetic interference (EMI), radio frequency interference (RFI), and other various noise interferences are increasingly serious. When two parallel wires in a wiring network of the printed circuit board incur near end crosstalk or coupling, the following methods are applied: (1) installing a decoupling capacitor or enlarging the spacing between the wires, but under the requirement of dense wiring, only the parallel length thereof can be decreased to reduce mutual inductance of a magnetic field and mutual capacitance of an electric field; or, (2) decreasing the thickness of the insulating layer to enable crosstalk energy to be grounded.

In order to make the micro via, multiple non-mechanical drilling methods are developed. For example, IBM developed a surface laminar circuits (SLC) photo-via technology in the YASU factory in Japan in 1989; then, laser ablation, plasma via-etching, dry via-etching, and wet chemical via-etching followed. According to the photo-via technology, a photosensitive resin undergoes a photographic imaging process, and the micro via is formed through steps such as exposure and development. However, besides photosensitive property, other properties of the photosensitive resin such as desirable electric properties, desirable mechanical properties, chemical resistance for the photographic imaging process, and high heat resistance for a lamination process are required.

For example, for the desirable electric properties, the breakdown voltage (dielectric Strength) needs to bear a basic 2 KV voltage, and the breakdown voltage relates to the thickness of the insulating layer. A currently applied photosensitive insulating layer is an epoxy resin, but in order to meet the requirement of breakdown voltage, the thickness of the epoxy resin shall be at least greater than 50 μm. Many polymers having desirable electric properties must be pressed in the lamination process only under a high temperature because the glass transition temperature (Tg) thereof is too high, which makes the application difficult.

On the other hand, for the laser ablation or plasma via-etching method, when a layer is added, an adhesive layer, which is generally an epoxy resin, is additionally required, so that the thickness of the insulating layer thereof is at least greater than 32 μm.

Further, referring to FIG. 1, in order to manufacture a conventional printed laminated circuit board 1, a first wiring layer 11 is provided first, and a first circuit 12 is formed on the first wiring layer 11. Then, the first circuit 12 is covered by an insulating first cover film 13 that is mechanically punched. In order to further perform lamination, an adhesive layer 14 is provided; then a second wiring layer 15 is placed on the adhesive layer 14. Further, a second circuit 16 is formed; then the second circuit 16 is covered by a second cover film 17. In order to enable the first circuit 12 and the second circuit 16 to be electrically connected, a via needs to be formed through the first cover film 13, the adhesive layer 14, and the second wiring layer 15 through laser ablation; then a connecting conductor 18 is formed in the via through filling, chemical plating or electroplating, to connect the first circuit 12 and the second circuit 16. Then, the second circuit is used as another first circuit, the second cover film is used as another first cover film, and the aforementioned steps, such as providing a wiring layer, forming a circuit, using a cover film for coverage, using an adhesive layer for adhesion, ablation, and forming a connecting conductor are repeated, so as to manufacture the conventional printed laminated circuit board 1. The manufacturing method cannot decrease the overall thickness of the printed laminated circuit board, and the complicated manufacturing processes increase the difficulty in manufacturing. Furthermore, it is not easy to align multiple layers, which results in that a short circuit phenomenon is likely to be incurred. Moreover, when the first cover film 13 and the second cover film 17 cover the first circuit 12 and the second circuit 16, or when the adhesive layer 14 performs adhesion, a high-temperature pressing is required, which increases the difficulty of the process.

Therefore, in the field, a novel printed laminated circuit board and manufacturing thereof urgently need to be provided, so as to meet requirements incurred by development of electronic appliances.

SUMMARY OF THE INVENTION

The present invention develops a novel printed laminated circuit board and manufacturing method thereof, so as to dramatically decrease the overall thickness of the printed laminated circuit board, especially decrease the thickness of an insulating layer. The manufacturing procedures of the printed laminated circuit board is reduced through a modularized production, and the product yield is increased; the short circuit phenomenon is reduced, thereby decreasing manufacturing costs.

Therefore, the invention provides a vertical conductive unit, which comprises:
- an insulating layer comprising an upper surface and a lower surface, and the insulating layer comprising a connecting via running through the insulating layer;
- a first conductor contacting the lower surface of the insulating layer;
- a second conductor contacting the upper surface of the insulating layer; and a third conductor located in the connecting via and contacting the first conductor and the second conductor;

wherein the insulating layer comprises photosensitive polyimide, and the glass transition temperature of the photosensitive polyimide is lower than about 200° C.

The present invention further provides a method for manufacturing the aforementioned vertical conductive unit, which comprises:
- (a1) providing the first conductor;
- (b1) forming the insulating layer on the first conductor to make the first conductor contact the lower surface of the insulating layer;
- (c1) forming the connecting via by photographic imaging in a predetermined position;
- (d1) forming the third conductor in the connecting via to make the third conductor contact the first conductor; and
- (e1) forming the second conductor to make the upper surface of the insulating layer contact the second conductor, and make the third conductor contact the second conductor.

The present invention further provides a method for manufacturing the aforementioned vertical conductive unit, which comprises:
- (a2) providing the first conductor;
- (b2) forming the third conductor to make the first conductor contact the third conductor;
- (c2) coating the first conductor and the third conductor with the insulating layer;
- (d2) removing a part of the insulating layer that covers the third conductor by photographic imaging; and
- (e2) forming the second conductor to make the upper surface of the insulating layer contact the second conductor, and make the third conductor contact the second conductor.

DETAILED DESCRIPTION OF THE INVENTION

Figure 1:
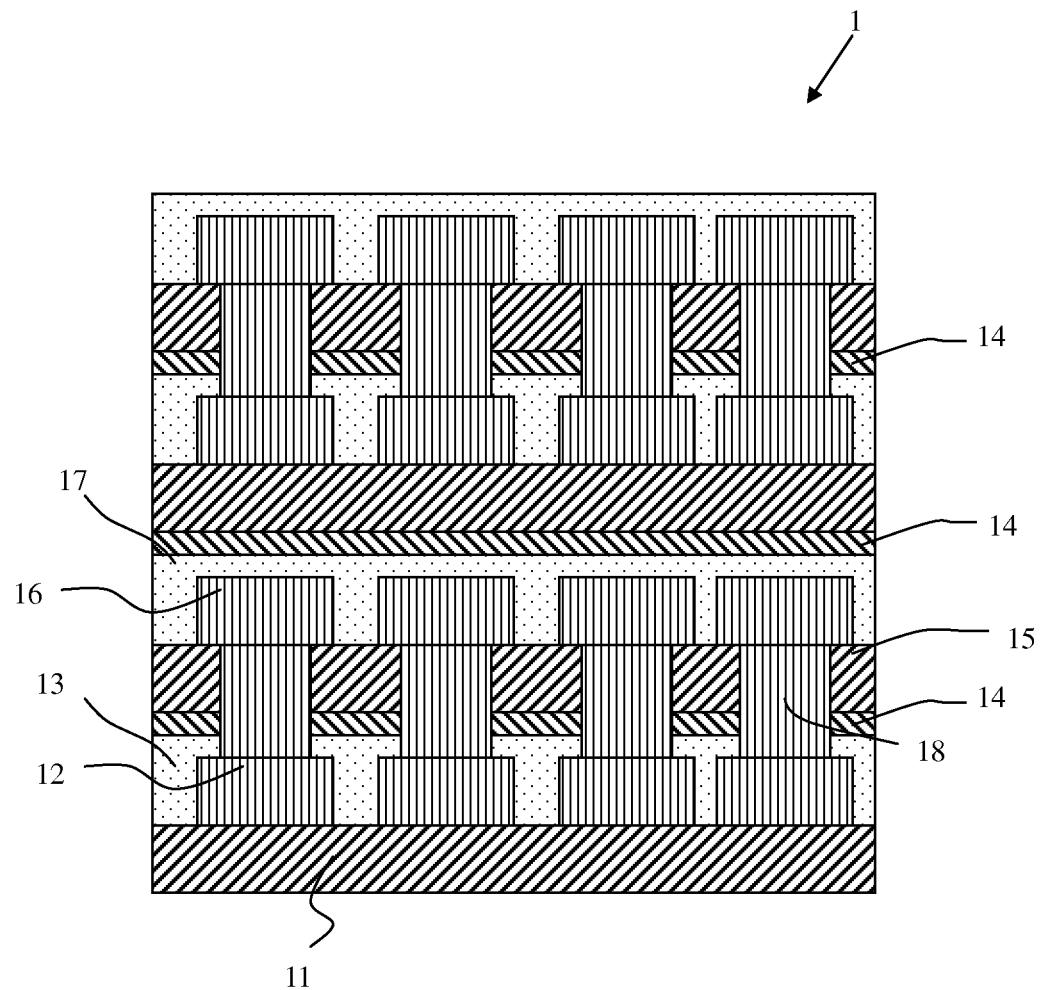
FIG. 1 is a sectional view of a conventional printed laminated circuit board.
Figure 2:
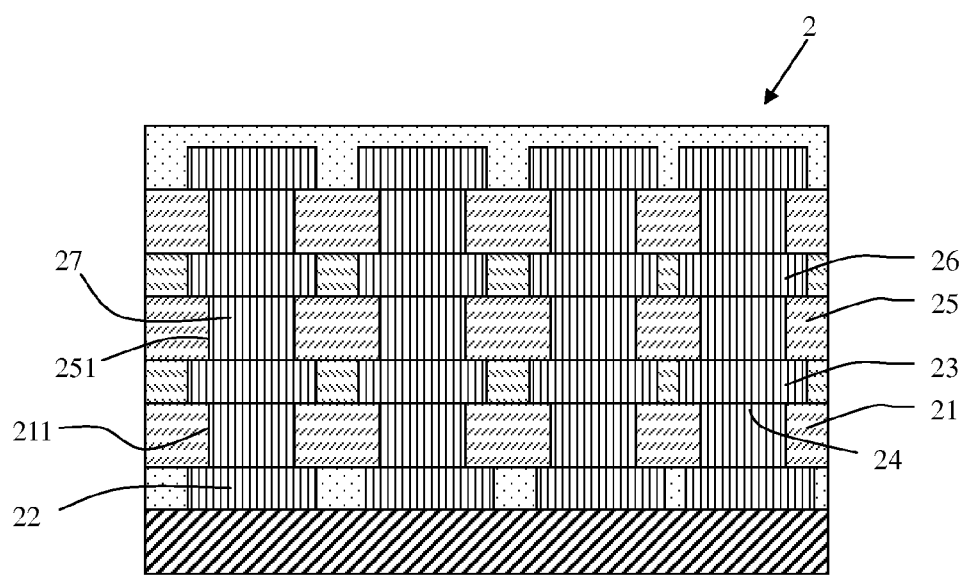
FIG. 2 is a sectional view of a printed laminated circuit board according to the invention.

Referring to FIG. 2, the invention provides a vertical conductive unit 2, which comprises:
- an insulating layer 21 comprising an upper surface and a lower surface, and the insulating layer comprising a connecting via 211 running through the insulating layer 21;
- a first conductor 22 contacting the lower surface of the insulating layer 21;
- a second conductor 23 contacting the upper surface of the insulating layer 21; and
- a third conductor 24 located in the connecting via 211 and contacting the first conductor 22 and the second conductor 23;
- wherein the insulating layer 21 comprises photosensitive polyimide, and the glass transition temperature of the photosensitive polyimide is lower than about 200° C.

A plurality of the vertical conductive units according to the present invention can be stacked on each other to form a printed laminated circuit board, and the vertical conductive units may be separated by an insulating material therebetween, or the second conductor of one vertical conductive unit is used as the first conductor of another vertical conductive unit, so as to further decrease the thickness of the printed laminated circuit board.

In a preferred embodiment of the present invention, referring to FIG. 2, the vertical conductive unit 2 further comprises:
- a second insulating layer 25 comprising an upper surface and a lower surface, and the second insulating layer comprising a second connecting via 251 running through the second insulating layer 25, and the lower surface of the second insulating layer 25 contacting the second conductor 23;
- a fourth conductor 26 contacting the upper surface of the second insulating layer 25; and
- a fifth conductor 27 located in the second connecting via 251 and contacting the second conductor 23 and the fourth conductor 26.

On the other hand, because the glass transition temperature of the photosensitive polyimide included in the insulating layer according to the present invention is lower than about 200° C., preferably from about 90° C. to about 180° C., and more preferably from 90° C. to about 130° C., so as to make low-temperature pressing applicable, and the insulating layer completely replaces the wiring layer, the cover film and the adhesive layer in the prior art. Wiring and coverage processes are able to be performed on the insulating layer at the same time, and the thickness and manufacturing procedures of the printed laminated circuit board is reduced thereby. In a preferred embodiment of the present invention, low-temperature pressing is applicable to the photosensitive polyimide insulating layer of the present invention, so that the photosensitive polyimide insulating layer can be coated on the first conductor, and the connecting via can be formed through the photographic imaging process; the connecting via is filled with the third conductor; and then the second conductor is pressed to form the vertical conductive unit. The coating, via forming, via filling, and pressing are repeated, so as to form the printed laminated circuit board. The manufacturing method can completely avoid the conventional process of using the adhesive layer to bond the circuit, covered by the cover film, of each layer, so as to decrease the procedures and difficulty of manufacturing. Moreover, no interlayer bonding or alignment is required in the manufacturing method according to the invention, and a short circuit phenomenon is also avoided.

In one embodiment of the present invention, the vertical conductive unit is a prefabricated modular unit, and multiple modular units are stacked to form the printed laminated circuit board.

In another embodiment of the present invention, the vertical conductive unit is a structural unit of the printed laminated circuit board, which is formed layer by layer to manufacture the printed laminated circuit board.

According to the present invention, the thickness of the insulating layer may be determined according to needs. Compared with the epoxy resin in the conventional art, the polyimide has better properties, and the thickness thereof for meeting the requirement of breakdown voltage resistant break is from about 15 μm to about 20 μm. Therefore, the thickness of the insulating layer ranges from about 15 μm to about 20 μm, which is dramatically decreased when compared with that in the prior art, and the electric properties of the printed laminated circuit board can be improved obviously.

In a preferred embodiment of the present invention, the photosensitive polyimide comprised in the insulating layer is visible-light transparent, so as it is applicable to manufacture a fully-transparent printed laminated circuit board.

According to the invention, the materials of the insulating layers are consistent in the printed laminated circuit board comprising the vertical conductive unit, so that the variant of size is small. Furthermore, because the thickness of the photosensitive polyimide resin of the insulating layer is small, the whole printed laminated circuit board is thinner, and the microstrip wiring density can be increased. When as a stripline of a thin plate, various noise interferences, such as near end crosstalk, EMI, and RFI, are further reduced.

In a preferred embodiment of the present invention, the photosensitive polyimide is a photo-curing copolymer. Preferably, the photosensitive polyimide is copolymerized by a unit represented by formula (1) and a unit represented by formula (2),

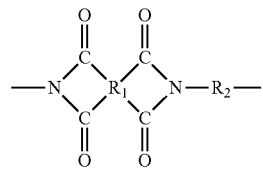

formula (1)

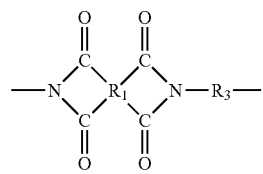

formula (2)

wherein:

$R_1$ is selected from the group consisting of formulae (3) to (8);

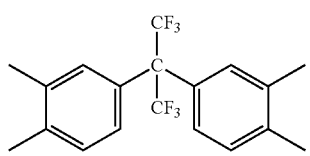

formula (3)

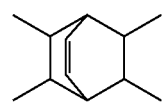

formula (4)

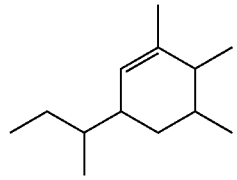

formula (5)

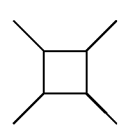

formula (6)

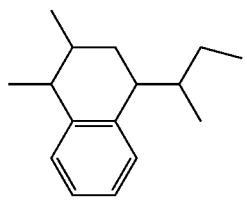

formula (7)

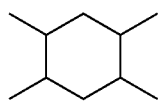

formula (8)

$R_2$ is selected from the group consisting of formulae (9) to (14);

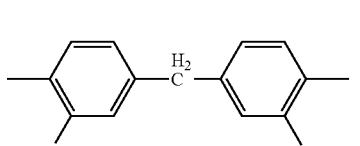

formula (9)

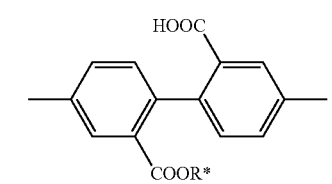

formula (10)

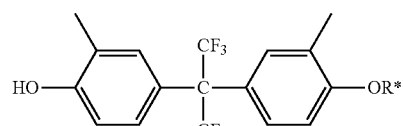

formula (11)

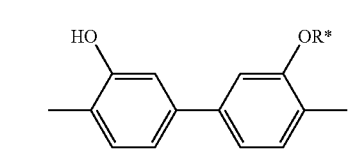

formula (12)

formula (13)

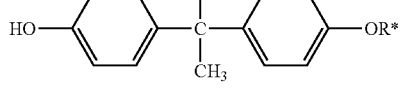

formula (14)

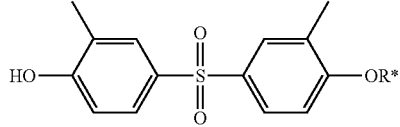

R* represents

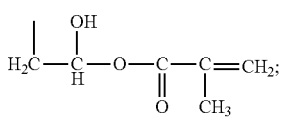

$R_3$ represents

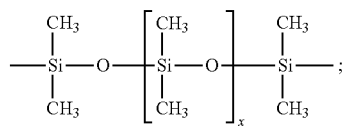

and

X represents an integer from 1 to 20.

The molar ratios of formula (1) and formula (2) are not limited; preferably, The molar ratios of formula (1) and formula (2) are about 2:8 to about 8:2; more preferably are about 4:6 to about 6:4.

In a preferred embodiment of the present invention, the photosensitive polyimide further comprises a photoinitiator and a photocrosslinking agent.

The kinds of the photoinitiator are not limited. Preferably, the kinds of the photoinitiator are determined according to the kinds of the photosensitive polyimide or photocrosslinking agent. The photoinitiator includes but not limited to bis(2,4,6-trimethylbenzoyl)phenyl phosphineoxide, bis(2,6-difluoro-3-(1-hydropyrrol-1-yl)phenyl)titanocene, or 2,4,6-trimethylbenzoyldiphenylphosphine oxide.

The kinds of the photocrosslinking agent are not limited. Preferably, the kinds of the photocrosslinking agent are determined according to the kinds of the photosensitive polyimide or photoinitiator. The photocrosslinking agent includes but not limited to tris(2-hydroxyethyl)isocyanurate triacrylate, pentaerythritol triacrylate, or ethoxylated (30) bisphenol A diacrylate (manufactured by ECHO CHEMICAL CO., LTD).

The preparation method of the photo-curing photosensitive polyimide is not limited. A general polymerization method may be used, that is: under nitrogen, diamine and anhydride comprising reactive groups are dissolved in a solvent to perform a polymerization reaction to obtain a polyamic acid. Then, a hot solution cyclization method is applied to use an entrainer to perform cyclodehydration at 180° C. to obtain a soluble polyimide solution having a side reactive group. Furthermore, an epoxide including an ethylenically-unsaturated photosensitive group is used to modify the polyimide solution to obtain the photosensitive polyimide. The photoinitiator and photocrosslinking agent are further added to form the photo-curing photosensitive polyimide composition.

With the effects of the present invention unaffected, in the preparation method of the photo-curing photosensitive polyimide, other reagents may be selectively added to increase reaction efficiency. For example, a catalyst, an inhibitor, an entrainer, and a leveling agent, or a combination thereof.

The catalyst includes but not limited to tetra-n-butylammonium bromide (hereafter as TBAB), triethylamine (hereafter as TEA), or imidazole.

The inhibitor includes but not limited to hydroquinone or 4-methoxyphenol.

The entrainer includes but not limited to xylene.

The leveling agent includes but not limited to BYK-378 or BYK-354 (manufactured by Shei-Chain Enterprise Corp.).

In one preferred embodiment of the invention, the photosensitive polyimide is a photoacid-generated photosensitive polyimide. Preferably, the photosensitive polyimide comprises a unit represented by formula (15),

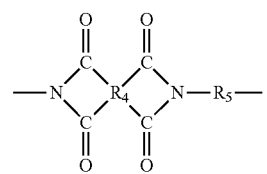

formula (15)

wherein:

$R_4$ represents

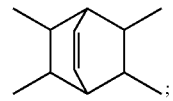

;

$R_5$ is selected from the group consisting of formulae (16) to (22);

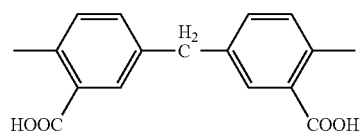

formula (16)

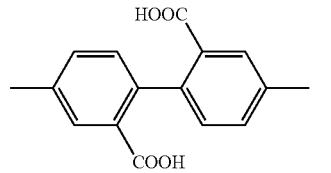

formula (17)

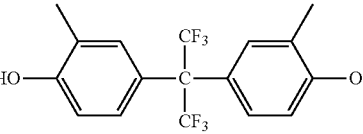

formula (18)

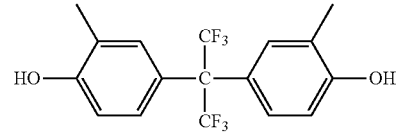

formula (19)

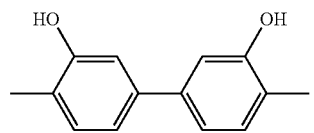

formula (20)

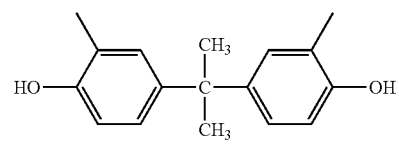

formula (21)

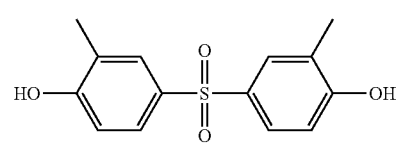

formula (22)

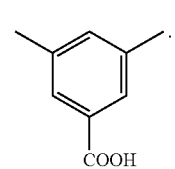

In one preferred embodiment of the invention, the photosensitive polyimide further comprises a photoacid generator and a photocrosslinking agent.

The photoacid generator includes but not limited to nitrobenzyl-9,10-diethoxyanthracene-2-sulfonate, or diphenyliodonium-9,8-dimethoxyanthracene sulfonate. The content of the photoacid generator according to the invention is from about 1 to about 50 parts by weight; preferably from about 3 to about 20 parts by weight based on 100 parts by weight of the content of the photosensitive polyimide.

The photocrosslinking agent includes but not limited to 2-hydroxymethyl-4,6-dimethylphenol, 1,3,5-trihydroxymethylbenzene, 3,5-dihydroxymethyl-4-methoxytoluene[2,6-bis(hydroxymethyl)-p-cresol. The content of the photocrosslinking agent according to the invention is from about 1 to about 50 parts by weight; preferably from about 3 to about 15 parts by weight based on 100 parts by weight of the content of the photosensitive polyimide.

The preparation method of the photoacid-generated photosensitive polyimide is not limited. A general polymerization method may be used, that is: diamine and anhydride comprising reactive groups are dissolved in a solvent to perform a polymerization reaction to obtain a polyamic acid. Then, a dehydration reaction is performed on the polyamic acid to perform a polyimide reaction, and the photoacid generator and the photocrosslinking agent are added to form the photoacid-generated photosensitive polyimide.

With the effects of the present invention unaffected, in the preparation method of the photoacid-generated photosensitive polyimide, other reagents may be selectively added to increase reaction efficiency. For example, an entrainer, and a leveling agent, or a combination thereof.

The entrainer includes but not limited to xylene.

The leveling agent includes but not limited to BYK-378 or BYK-354 (manufactured by Shei-Chain Enterprise Corp.).

According to the present invention, the number of the insulating layers may be one or multiple, so as to reconcile the mechanical properties and heat resistance of the insulating layer and reduce the cost of use of the insulating layer. In a preferred embodiment of the present invention, the insulating layer comprises a first insulating layer and a second insulating layer; wherein the first insulating layer comprises the photosensitive polyimide, and the second insulating layer comprises an alkali-soluble polyimide.

In a preferred embodiment of the present invention, the second insulating layer contacts the first conductor, and the first insulating layer contacts the second conductor. Since the first insulating layer is photosensitive, the position of the connecting via may be determined in an exposure process, and the connecting via may be formed in a development process in an alkaline developing solution. On the other hand, although the second insulating layer is not photosensitive, the position corresponding to the connecting via is alkali-soluble, so as a part of the position corresponding to the connecting via is dissolved in the development process, and a part without corresponding to the connecting via is covered by the first insulating layer and therefore cannot contact the alkaline developing solution and cannot be dissolved, thereby achieving the connecting via.

According to the present invention, the alkali-soluble polyimide refers to a polyimide polymer capable of dissolving in an alkali solution, and preferably a monomer thereof has a —COOH or —OH functional group. In one preferred embodiment of the invention, the alkali-soluble polyimide comprises a unit represented by formula (23)

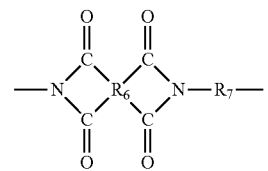

formula (23)

wherein:

$R_6$ represents a four-valence organic group;

$R_7$ is selected from the group consisting of formulae (24) to (30);

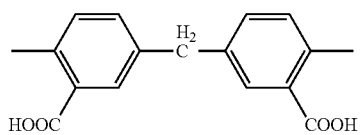

formula (24)

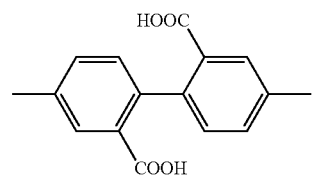

formula (25)

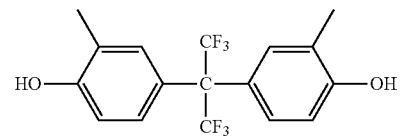

formula (26)

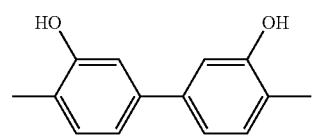

formula (27)

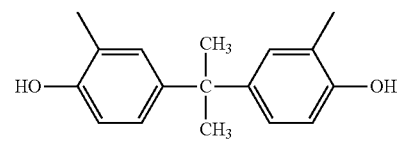

formula (28)

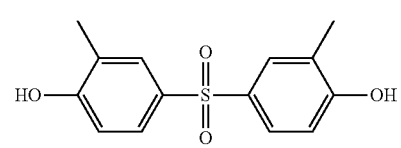

formula (29)

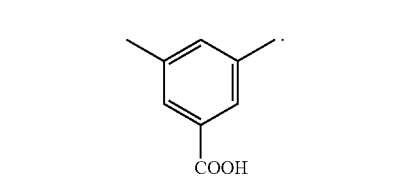

formula (30)

According to the present invention, the first conductor, the second conductor, or the third conductor refers to a conductive substance, and the material thereof includes, but not limited to, a conductive metal or a conductive compound. The forms thereof may be a conductive block, a conductive wire, a conductive sheet, an element having an electricity-conducting function, and a line module having an electricity-conducting function.

In a preferred embodiment of the present invention, the elements having the electricity-conducting function include, but not limited to, a capacitor, a resistor, a die, an inductor, a diode, an integrated circuit, a transistor, a light-emitting diode, a camera photosensitive element, and a micro projection element.

In a preferred embodiment of the present invention, the line module having the electricity-conducting function includes, but not limited to, a printed circuit.

In a preferred embodiment of the present invention, the insulating layer further includes an empty via running through the insulating layer. The empty via is not filled with any conductor, and acts as an open via or is for structural connection.

The present invention further provides a method for manufacturing the aforementioned vertical conductive unit, which comprises:
  (a1) providing the first conductor;
  (b1) forming the insulating layer on the first conductor to make the first conductor contact the lower surface of the insulating layer;
  (c1) forming the connecting via by photographic imaging in a predetermined position;
  (d1) forming the third conductor in the connecting via to make the third conductor contact the first conductor; and
  (e1) forming the second conductor to make the upper surface of the insulating layer contact the second conductor, and make the third conductor contact the second conductor.

In a preferred embodiment of the present invention, the manner for forming the insulating layer in Step (b1) is coating. For example, a scraper is used to coat the first conductor with the photosensitive polyimide.

In a preferred embodiment of the present invention, the manner of forming the connecting via by photographic imaging may be a general one. For example, a composition comprising the photosensitive polyimide is applied on the first conductor. And then, the coated composition is prebaked to remove a solvent, thereby forming a prebaked coating film. The prebake step is carried out in various conditions, for example, at 80° C. to 90° C. for 5 to 15 minutes, which depend upon the kinds and the mixing ratio of components. After the prebake step, the prebaked coating film is exposed under a given mask. The exposure light is preferably UV light such as g-line, h-line, i-line and so on, which may be generated by a UV illumination device such as (super) high-pressure mercury lamp or metal halide lamp. The film is immersed in a developing solution for 1 minute to 2 minutes, thereby removing undesired areas and forming a given pattern. Specific examples of the developing solution include but not limited to alkaline compounds such as sodium hydroxide, potassium hydroxide, sodium carbonate, sodium bicarbonate, potassium carbonate, potassium bicarbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabicyclo-[5,4,0]-7-undecene and the like. When the aforementioned alkaline compounds are included in the developing solution, the coating film can be washed by water after being developed, and then be dried by compressed air or nitrogen gas. Next, the coating film is postbaked by using a hot plate, an oven or other heating device. The postbake step can be carried out at 200° C. to 250° C. After those steps, the via is formed in the substrate.

In a preferred embodiment of the present invention, the manner of forming the third conductor in the connecting via in Step (d1) is filling, sputtering, chemical plating, or electroplating. The filling, sputtering, chemical plating, and electroplating can be implemented by persons of ordinary skill in the art of the present invention.

In a preferred embodiment of the present invention, the method further comprises a step of etching the third conductor before Step (e1).

In a preferred embodiment of the present invention, the manner of forming the second conductor in Step (e1) is obtained by circuit etching after providing a metal sheet.

In another preferred embodiment of the present invention, the manner for forming the second conductor in Step (e1) is combined with the manner for forming the third conductor in Step (d1) to provide a conductor layer, where the conductor in the connecting via is as the third conductor and the conductor contacting the upper surface of the insulating layer is as the second conductor.

In a preferred embodiment of the present invention, the method further comprises Step (f1) of etching the second conductor.

In a preferred embodiment of the present invention, the method further comprises:
  (g1) forming a second insulating layer on the second conductor to make the second conductor contact the lower surface of the second insulating layer;
  (h1) forming the second connecting via by photographic imaging in a predetermined position on the second insulating layer;
  (i1) forming the fifth conductor in the second connecting via to make the fifth conductor contact the second conductor; and
  (j1) forming the fourth conductor to make the upper surface of the second insulating layer contact the fourth conductor, and make the fifth conductor contact the fourth conductor.

The present invention further provides a method for manufacturing the aforementioned vertical conductive unit, which comprises:
  (a2) providing the first conductor;
  (b2) forming the third conductor to make the first conductor contact the third conductor;
  (c2) coating the first conductor and the third conductor with the insulating layer;
  (d2) removing a part of the insulating layer that covers the third conductor by photographic imaging; and
  (e2) forming the second conductor to make the upper surface of the insulating layer contact the second conductor, and make the third conductor contact the second conductor.

In a preferred embodiment of the present invention, the method further comprises:
  (f2) providing the fifth conductor to make the second conductor contact the fifth conductor;
  (g2) coating the second conductor and the fifth conductor with the second insulating layer;
  (h2) removing a part of the second insulating layer that covers the fifth conductor by photographic imaging; and
  (i2) forming the fourth conductor to make the upper surface of the second insulating layer contact the fourth conductor, and make the fifth conductor contact the fourth conductor.

The manners of coating, photographic imaging, and forming the second conductor and the third conductor are according to the above description.

In a first embodiment, the method for manufacturing the aforementioned vertical conductive unit comprising:
- (11) providing a first conductor;
- (12) coating the first conductor with an insulating layer to make the first conductor contact the lower surface of the insulating layer;
- (13) exposing the insulating layer in a predetermined position of a connecting via, and forming the connecting via by photographic imaging;
- (14) filling a third conductor in the connecting via to make the third conductor contact the first conductor; and
- (15) hot-pressing a metal sheet on the third conductor and etching the metal sheet to form a second conductor to make the upper surface of the insulating layer contact the second conductor, and make the third conductor contact the second conductor.

In a second embodiment, the method for manufacturing the aforementioned vertical conductive unit comprising:
- (21) providing a first conductor;
- (22) coating the first conductor with an insulating layer to make the first conductor contact the lower surface of the insulating layer;
- (23) exposing the insulating layer in a predetermined position of a connecting via, and forming the connecting via by photographic imaging;
- (24) chemical plating or electroplating a conductive layer on the insulating layer and forming a third conductor in the connecting via to make the third conductor contact the first conductor; and
- (25) forming a second conductor by etching wire on the conductive layer where contacting the upper layer of the insulating layer to make the upper surface of the insulating layer contact the second conductor, and make the third conductor contact the second conductor.

In a third embodiment, the method for manufacturing the aforementioned vertical conductive unit comprising:
- (31) providing a first conductor;
- (32) coating the first conductor with a second insulating layer and coating a first insulating layer on the second insulating layer to make the first conductor contact the lower surface of the insulating layer;
- (33) exposing the insulating layer in a predetermined position of a connecting via, and forming the connecting via by photographic imaging;
- (34) filling a third conductor in the connecting via to make the third conductor contact the first conductor; and
- (35) hot-pressing a metal sheet on the third conductor and etching the metal sheet to form a second conductor to make the upper surface of the insulating layer contact the second conductor, and make the third conductor contact the second conductor.

In a fourth embodiment, the method for manufacturing the aforementioned vertical conductive unit comprising:
- (41) providing a first conductor;
- (42) printing to form a third conductor to make the first conductor contact the third conductor;
- (43) coating the first conductor and the third conductor with an insulating layer;
- (44) exposing a part of the insulating layer that covers the third conductor and forming a connective via by photographic imaging; and
- (e2) hot-pressing a metal sheet on the third conductor and etching the metal sheet to form a second conductor to make the upper surface of the insulating layer contact the second conductor, and make the third conductor contact the second conductor.

The following examples are given for the purpose of illustration only and are not intended to limit the scope of the present invention.

Example 1

One-hundred parts by weight of a modified photosensitive polyimide copolymer, 10 parts by weight of a photoinitiator, and 30 parts by weight of a photocrosslinking agent are agitated and mixed evenly, so as to obtain a photo-curing polyimide composition. A substrate of copper foil is coated with the photo-curing polyimide composition. Pre-baking is performed in a temperature ranging from 80° C. to 90° C. for 5 minutes to 15 minutes, and then exposure is performed in a predetermined position of a connecting via. Furthermore, development-based via-forming is performed to form the connecting via, and after washing is completed with water after the development, the water on the surface is removed. The composition is placed in an oven to undergo baking in a temperature ranging from 200° C. to 250° C. for 1 hour to 2 hours. The connecting via is filled with silver-containing or copper-containing conductive resin via filler. The insulating polyimide layer having the via filled with the conductive via filler is pressed on a piece of copper foil in a temperature ranging from 200° C. to 250° C. to form a vertical conductive unit, where a first copper foil conductive layer and a second copper foil conductive layer on two sides of the insulating polyimide layer are conducted through the silver-containing or copper-containing conductive resin via filler in the connecting via.

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:
1. A vertical conductive unit, which comprises:
- an insulating layer comprising an upper surface and a lower surface, and the insulating layer comprising a connecting via running through the insulating layer;
- a first conductor contacting the lower surface of the insulating layer;
- a second conductor contacting the upper surface of the insulating layer; and
- a third conductor located in the connecting via and contacting the first conductor and the second conductor;
- wherein the insulating layer comprises photosensitive polyimide, and a glass transition temperature of the photosensitive polyimide is lower than about 200° C. and
- wherein the photosensitive polyimide is copolymerized by a unit represented by formula (1) and a unit represented by formula (2),

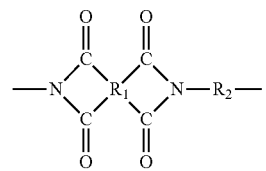

formula (1)

-continued

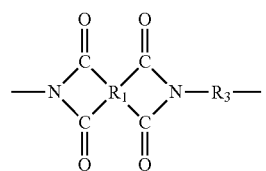

formula (2)

wherein:

R₁ is selected from the group consisting of formulae (3) to (8);

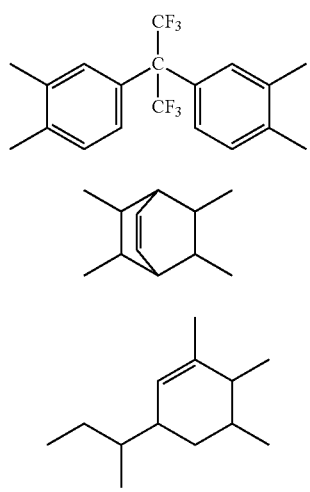

formula (3)

formula (4)

formula (5)

formula (6)

formula (7)

formula (8)

R₂ is selected from the group consisting of formulae (9) to (14);

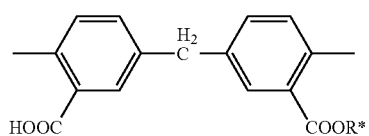

formula (9)

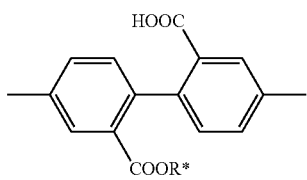

formula (10)

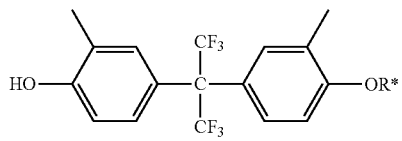

formula (11)

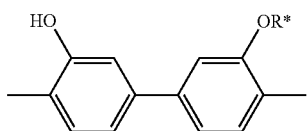

formula (12)

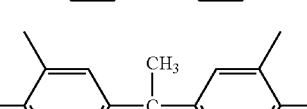

formula (13)

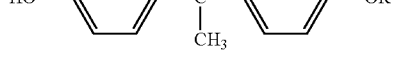

formula (14)

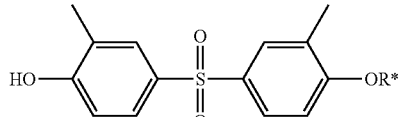

R* represents

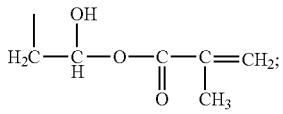

R₃ represents and

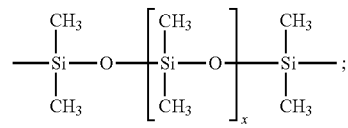

x represents an integer from 1 to 20.

2. The vertical conductive unit according to claim 1, which further comprises:
   a second insulating layer comprising an upper surface and a lower surface, and the second insulating layer comprising a second connecting via running through the second insulating layer, and the lower surface of the second insulating layer contacting the second conductor;
   a fourth conductor contacting the upper surface of the second insulating layer; and
   a fifth conductor located in the second connecting via and contacting the second conductor and the fourth conductor.

3. The vertical conductive unit according to claim 1, wherein the photosensitive polyimide further comprises a photoinitiator and a photocrosslinking agent.

4. The vertical conductive unit according to claim 1, wherein the first conductor, second conductor or third conductor is selected from the group consisting of a conductive block, a conductive wire, a conductive sheet, an element having an electricity-conducting function, and a line module having an electricity-conducting function.

5. The vertical conductive unit according to claim 1, wherein the insulating layer comprises a first insulating layer and a second insulating layer; wherein the first insulating layer comprises the photosensitive polyimide, and the second insulating layer comprises an alkali-soluble polyimide.

6. The vertical conductive unit according to claim 1, wherein the insulating layer further comprises an empty via running through the insulating layer.

7. A vertical conductive unit, which comprises:
 an insulating layer comprising an upper surface and a lower surface, and the insulating layer comprising a connecting via running through the insulating layer;
 a first conductor contacting the lower surface of the insulating layer;
 a second conductor contacting the upper surface of the insulating layer; and
 a third conductor located in the connecting via and contacting the first conductor and the second conductor;
 wherein the insulating layer comprises photosensitive polyimide, and a glass transition temperature of the photosensitive polyimide is lower than about 200° C., and
 wherein the photosensitive polyimide is copolymerized by a unit represented by formula (15), formula (15)

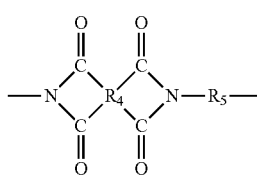

wherein:
R$_4$ represents

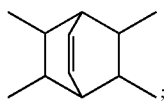

and

R$_5$ is selected from the group consisting of formulae (16) to (22);

formula (16)

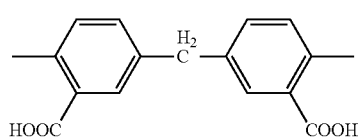

formula (17)

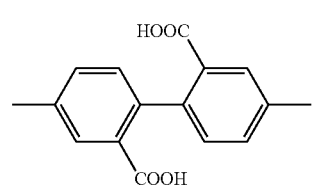

formula (18)

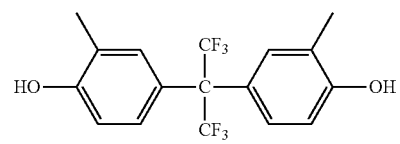

formula (19)

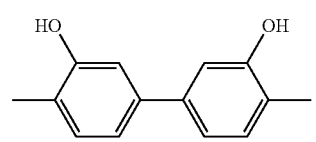

formula (20)

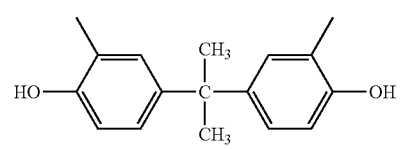

formula (21)

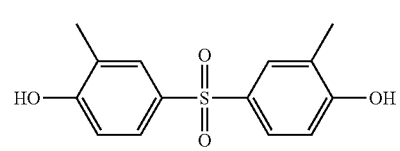

formula (22)

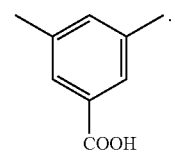

8. The vertical conductive unit according to claim 7, which further comprises:
 a second insulating layer comprising an upper surface and a lower surface, and the second insulating layer comprising a second connecting via running through the second insulating layer, and the lower surface of the second insulating layer contacting the second conductor;
 a fourth conductor contacting the upper surface of the second insulating layer; and
 a fifth conductor located in the second connecting via and contacting the second conductor and the fourth conductor.

9. The vertical conductive unit according to claim 7, wherein the photosensitive polyimide further comprises a photoacid generator and a photocrosslinking agent.

10. The vertical conductive unit according to claim 7, wherein the first conductor, second conductor or third conductor is selected from the group consisting of a conductive block, a conductive wire, a conductive sheet, an element having an electricity-conducting function, and a line module having an electricity-conducting function.

11. The vertical conductive unit according to claim 7, wherein the insulating layer comprises a first insulating layer and a second insulating layer; wherein the first insulating layer comprises the photosensitive polyimide, and the second insulating layer comprises an alkali-soluble polyimide.

12. The vertical conductive unit according to claim 7, wherein the insulating layer further comprises an empty via running through the insulating layer.

\* \* \* \* \*